Nov. 16, 1965 J. M. HOVEY 3,218,465

BI-STABLE CIRCUIT FOR GATING AND LOGIC EMPLOYING TUNNEL DIODES

Filed May 8, 1961 2 Sheets-Sheet 1

INVENTOR
JOHN M. HOVEY

BY Richard T. Reed
John E. Kidd

ATTORNEYS

Nov. 16, 1965 J. M. HOVEY 3,218,465

BI-STABLE CIRCUIT FOR GATING AND LOGIC EMPLOYING TUNNEL DIODES

Filed May 8, 1961 2 Sheets-Sheet 2

INVENTOR
JOHN M. HOVEY

BY John E. Kidd

ATTORNEYS

United States Patent Office 3,218,465

Patented Nov. 16, 1965

3,218,465

BI-STABLE CIRCUIT FOR GATING AND LOGIC EMPLOYING TUNNEL DIODES

John M. Hovey, Oxon Hill, Md., assignor to the United States of America as represented by the Secretary of the Navy Filed May 8, 1961, Ser. No. 108,683
10 Claims. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

This invention relates generally to an improved system of generating and controlling electrical pulse energy and more particularly to a unique semiconductor binary circuit for performing logic and gating functions.

In the past, circuits for counting repetitive pulse trains, triggering and other logic functions have, for example, been very useful as computer elements. Conventional logic systems and particularly flip-flops are largely transistorized and generally contain from 15 to 30 elements. These circuits, while providing adequate logic units, are expensive and comparatively large in size. This invention will provide the same results and perform the same functions as a transistor or vacuum tube flip-flop circuit but at a fraction of the cost and size.

Also existing today are many electrical systems that employ four layer or tunnel semiconductor devices, but due to the low level, low impedance of these circuits they become inconvenient for use when coupled with larger impedance transistor and vacuum tube circuits without considerable interconnecting circuitry. In tube circuits in particular, there is the added disadvantage of relatively large amounts of heater power being required for operation.

Accordingly it is an object of this invention to provide a low level, low impedance bistable logic circuit.

It is another object of my invention to provide a binary pulse counting and frequency dividing circuit which is highly stable and very reliable over a wide temperature range.

It is a further object of my invention to provide a bistable logic and gating circuit employing semiconductors having negative resistance characteristics.

Yet another object of my invention is to provide a flip-flop circuit wherein the unique switching characteristics of a tunnel diode are used for high speed counting and gating with minimum power requirements.

Still another object of my invention is to provide a binary switching circuit wherein pulsed electrical energy can be inexpensively processed with a minimum of components while still retaining the advantages of prior art logic circuits.

Other objects and many advantages of the invention will hereinafter become more fully apparent from the following description of the accompanying sheets of drawings which illustrate a preferred embodiment and wherein.

Briefly, this invention provides a highly stable binary control circuit employing in a unique circuit, the rapid switching characteristics of a tunnel diode with the conducting properties of an ordinary diode and the reflecting characteristics of a delay line.

Figure 1:
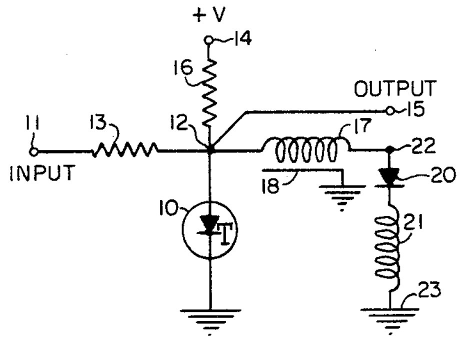
FIG. 1 is a circuit diagram of a bistable or control circuit in accordance with the principles of this invention.

Referring now to the drawings, wherein like parts are indicated by like reference numerals throughout the figures, and referring to FIG. 1 in particular, a two-terminal semiconductor device 10, capable of quantum mechanical tunneling of electrons through the p-n junction, is shown connected to a first junction point 12. Junction point 12 is biased by a positive voltage supply 14 of several volts, through resistor 16 and coupled to input terminal 11 by means of impedance 13. Also connected to junction point 12 are output terminals 15 and a delay line 17. Delay line 17 is terminated at junction point 22 so as to appear initially as an open circuit to any pulse traversing the delay line. In FIG. 1, an ordinary germanium or silicon diode 20 and inductive reactance 21 are shown coupling junction point 22 to a common reference point or ground 23.

Figure 2:
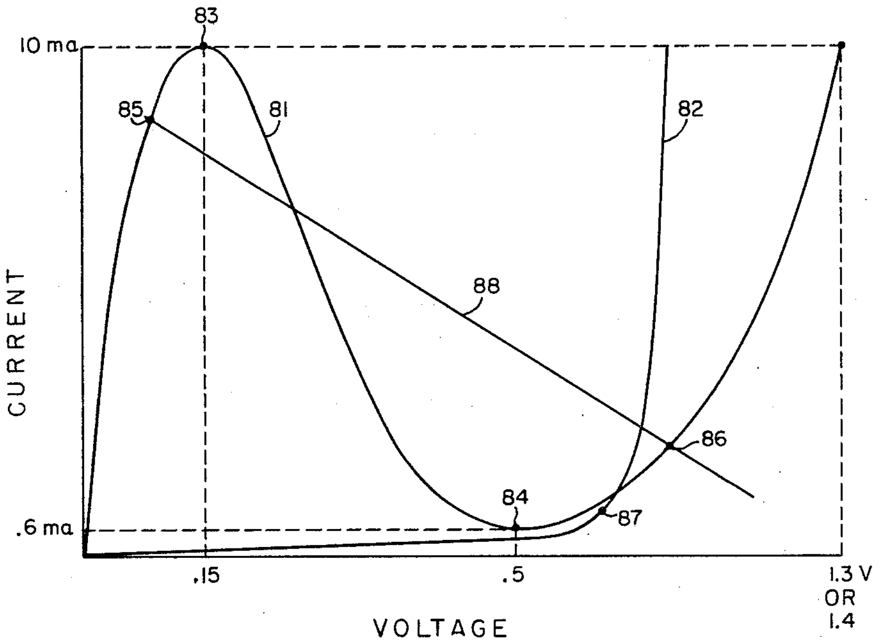
FIG. 2 is a current-voltage characteristic curve showing the static characteristic of a tunnel diode superimposed upon an ordinary diode curve.

Considering for the moment the current-voltage characteristic curves of the tunnel diode 10 and the ordinary diode 20, FIG. 2 shows each superimposed, one upon the other. A tunnel diode characteristic is shown by curve 81 with a peak current point at 83 and a valley point at 84 and, when operated with a load of sufficient resistance, a load line 88 can be determined. Load line 88 will have a high current-low voltage stable region represented by point 85 when the tunnel diode 10 is slightly biased and a low current-high voltage stable region represented by point 86 when tunnel diode 10 is triggered by a positive current pulse. Also shown in FIG. 2 superimposed upon curve 81, is the characteristic of the ordinary diode 20 as seen from curve 82. The choice of parameter values of the ordinary diode 20 are chosen so as to provide as sharp a knee at point 87 as possible and so as to be in the conducting state before the stable point 86 is reached by tunnel diode 10. In choosing a value for the ordinary diode 20, the principal consideration is for the knee of its characteristic curve to break before the lowest voltage point that load line 88 may swing to, while in the low current-high voltage stable region.

Considering now the operation of the binary control circuit shown in FIG. 1, junction point 12 is initially biased by source 14 and resistor 16 so as to cause tunnel diode 10 to be operating in the high current-low voltage region shown as point 85 on curve 81 in FIG. 2. The potential supplied by source 14 to tunnel diode 10 is approximately one volt but will depend upon the load impedance which is generally 1K ohm and whether a silicon or germanium diode is used at the end of delay line 17. At the same time, while junction point 22 is also biased by source 14, the potential is below the value required for ordinary diodes to conduct, consequently germanium diode 20 is nonconducting and the junction 22 appears as an open circuit at the end of delay line 17.

Figure 3:
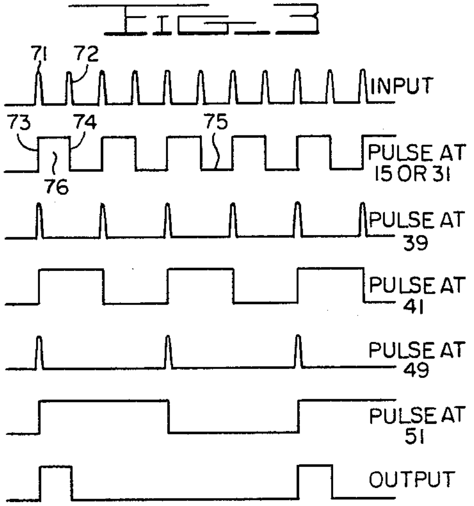
FIG. 3 depicts the waveforms, all shown with respect to the same time base, encountered at various points of the circuit shown in FIG. 4.

If a clock, such as the input pulse train shown in FIG. 3 is applied to input terminal 11 and the clock is of sufficient magnitude, the circuit of FIG. 1 will act as a counter and perform a 2:1 countdown developing the square wave pulse train 75 at output 15. The countdown occurs because the leading edge of pulse 71 causes junction point 12 to raise to a sufficiently high potential to trigger tunnel diode 10 into its low current-high voltage conducting region by providing a heavy flow of current through tunnel diode 10 to the common reference point 23. At the same time, the leading edge of the square wave pulse 76 is developed at output terminal 15. The leading edge of input pulse 71 also travels down delay line 17 arriving at junction point 22, seeing this point as initially an open circuit, the pulse is then reflected back to junction point 12 in the same polarity. Upon rearriving at junction 12 in the same polarity as input pulse 71 and with tunnel diode 10 in its low current-high voltage conducting state, the reflected pulse will help to sustain the width of output pulse 76. Since tunnel diode 10 is already switched into its second stable region, point 86, when the second pulse 72 of the input clock is applied to junction 12, like the reflected first pulse, it will have no effect on switching tunnel diode 10.

It should be noted here that the leading edge of the first pulse 71, while being reflected in the same polarity because of the open circuit at junction point 22, also causes this junction point to be raised to a sufficiently high potential to cause the ordinary diode 20 to begin conducting and lowers the impedance between point 22 and ground 23. This in effect causes junction point 22 to now appear as a short circuit at the end of delay line 17.

The second clock pulse 72 while having no effect initially on tunnel diode 10, will upon traveling through delay line 17, see junction point 22 now, at a very low impedance due to the increase in potential by the previous pulse 71, which caused diode 20 to conduct and will be reflected in opposite polarity back to junction point 12. When it reaches junction point, 12 being in opposite polarity, it causes the potential to be lowered by approximately the amount it was raised by the first pulse 71, restoring tunnel diode 10 to its initial stable region, point 85 and causing the trailing edge 74 of pulse 76 to be developed. Thus a 2:1 countdown has been effected.

Since junction point 12 is restored to its initial potential, junction 22 becomes insufficiently biased to keep diode 20 conducting thereby allowing junction 22 to return to its initial state of appearing as an open circuit.

Figure 5:
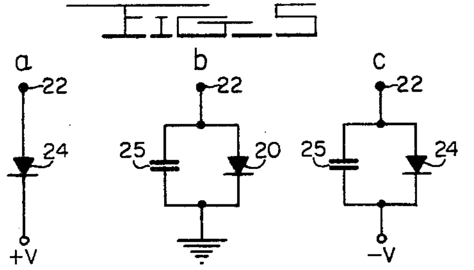
FIGS. 5*a*, *b* and *c* are various circuit modifications for shorting the delay line.

FIG. 5 shows several other embodiments for providing a short circuit or lowering the impedance between junction point 22 and common reference point 23. In FIG. *5a* a stabistor 24 is employed but due to its voltage-current characteristics at the voltage with which the circuit of FIG. 1 is operated, a small bias is required so as to bring the knee (point 87) of its characteristic curve (see FIG. 2) below the lowest point the load line 88 would swing. Another means of shorting junction point 22 as shown in FIG. *5b* is to provide an ordinary diode 20 and a very small capacitor 25 connected in parallel for coupling point 22 to the common reference point 23. It is also possible to connect a stabistor in parallel with capacitor 25 as another embodiment for the shorting circuit, but here a small bias is required due to more stable characteristics of stabistor 24, in order to bring the shorting circuit within the operating values of the tunnel diode.

Figure 4:
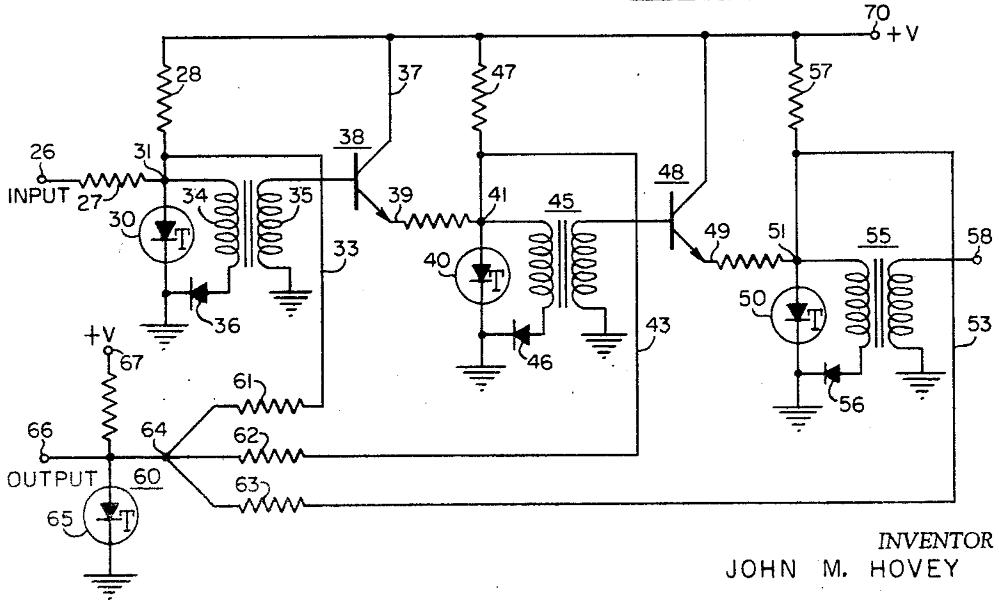
FIG. 4 shows a circuit diagram of a counting system according to the present invention.

While the circuit shown in FIG. 1 will provide a countdown of 2:1, FIG. 4 shows a practical example of the application of the principles of this invention for providing a multiple countdown circuit.

The counter circuit shown in FIG. 4 includes a plurality of bistable, fast switching tunnel diodes 30, 40 and 50 forming a 3-stage counter, each stage having a low impedance transformer and ordinary diode for utilizing the bistable characteristics of each tunnel diode. To couple the several stages of the counter circuit, a transistor emitter follower circuit, such as 38 and 48, are used. The output of each stage, 33, 43 and 53, is coupled to a 3-input logic AND circuit, shown generally at 60 and comprising tunnel diode 65 biased by a resistor and source 67 and having inputs 61, 62 and 63.

In operation, tunnel diodes 30, 40 and 50 are in their high current-low voltage stable region such as point 85 in FIG. 2, by means of resistors 28, 47 and 57 and source 70. If a train of positive pulses such as shown in FIG. 3 are applied at terminal 26, the potential at junction 31 is raised sufficiently to cause tunnel diode 30 to switch to its high voltage-low current region. As in FIG. 1, the leading edge of pulse 71 travels through inductance winding 34 but due to the high potential with which tunnel diode 30 holds junction 31 any overshoot or back E.M.F. that may be developed by the transformer in winding 34 is inadequate to switch tunnel diode 30. It is when the second pulse 72 is applied to junction point 31 that the overshoot developed by the transformer is sufficient to lower the potential to cause tunnel diode 30 to switch back to its high current-low voltage state. It appears that the second pulse 72 has caused an additional amount of current to be induced in the coil which in turn causes an added flux buildup subsequently developing a much larger overshoot than was experienced by the first pulse. It also appears that while the first pulse 71 increases the potential at junction 31, it also provides a substantial voltage drop across winding 34 whereas when the second pulse 72 is applied, the potential at junction 31 is increased, similarly to the first pulse but the voltage drop developed across winding 34 is insignificant as compared with the first pulse, the energy being expended in causing a larger buildup in flux in the coil.

The emitter follower 38 provides a differentiating circuit and is used to provide a trigger signal for the next succeeding stage. The differentiated output from tunnel diode 30 is then used to switch tunnel diode 40. The output from tunnel diode 40 is in turn differentiated by emitter follower 48 and used to trigger tunnel diode 50. For further counting, the output 58 of tunnel diode 50 can be applied to succeeding similar stages. The output signal from each stage is coupled to one input of the AND circuit 60. It should be appreciated that as the number of stages of the counter are increased, the number of inputs to the AND circuit will increase or other AND circuits required.

While a silicon tunnel diode and an ordinary germanium diode have been referred to throughout this disclosure, other semiconductor elements may be used and it appears that a gallium arsenide tunnel diode in combination with the stabistor or a back diode, would provide the ideal pair in the combination, provided their current-voltage characteristics can be maintained in a stable state.

In conclusion, this circuit by employing the extremely fast switching characteristics of a tunnel diode, the positive and negative reflecting characteristic of a delay line depending upon whether its end is an open or shorted circuit and the conducting and non-conducting properties of an ordinary diode depending upon the available potential will provide a relatively inexpensive, simple and very reliable binary logic circuit.

Various modifications are contemplated and may obviously be resorted to by those skilled in the art without departing from the spirit and scope of the invention, as hereinafter defined by the appended claims, as only a preferred embodiment thereof has been disclosed.

What is claimed is:

1. A binary circuit comprising first and second junction points, means for applying a repetitive input pulse signal to said first junction point, means for delaying said input signal, said delay means being connected between said first and second junction points, a common reference point, a single p-n junction diode exhibiting a negative conductance region when forwardly biased and a highly conductive capability when reversed biased connected between said first junction point and said common reference point, means for biasing said first junction point, and means for automatically periodically short circuiting said delay means.

2. The circuit as set forth in claim 1, wherein said short circuit means is a germanium diode and inductance connected in series between said second junction point and said common reference point.

3. The circuit as set forth in claim 1 wherein said short circuit means is a positively biased stabistor connected to said second junction point.

4. The circuit as set forth in claim 1 wherein said short circuit means is composed of a semiconductor and capacitive element connected in parallel to said second junction point.

5. A gating circuit comprising a tunnel diode, a first junction point, means for biasing said first junction point, input trigger means for applying a repetitive pulse train to said first junction point, a common reference point, said tunnel diode connected between said first junction and said common reference point, a second junction point, delay means coupled between said first and second junction points and means for automatically periodically short circuiting said delay means.

6. A circuit as set forth in claim 5, wherein said short circuit means comprises a biased semiconductor.

7. A circuit as set forth in claim 5, wherein said short circuit means is a series circuit comprising a germanium diode and an inductance coupled between said second junction point and said common reference.

8. A circuit as set forth in claim 5 wherein said short circuit means is a parallel circuit comprising a stabistor and capacitor coupled to said second junction point.

9. A counter circuit comprising a plurality of tunnel diode counting stages, each stage producing a signal and having a tunnel diode, inductive means and a diode serially connected to said inductive means, with said inductive means and said diode connected across said tunnel diode, means for applying an input signal to said counter circuit, means for biasing said tunnel diodes with a voltage whose magnitude is sufficient to raise each of said tunnel diodes into the high current-low voltage region, differentiating means at the output of said inductive means for providing a trigger for the next succeeding stage of each stage of said counter, and means for collecting the respective signals of each stage for providing an output signal representative of the several signals from the tunnel diode counting stages.

10. A counter circuit comprising a plurailty of stages, each stage producing a signal and comprising a tunnel diode and a transformer having a primary and secondary winding, a diode serially connected to said primary winding, said transformer primary winding and said diode being coupled across said tunnel diode, means for applying an input signal to said counter circuit, means for biasing said tunnel diodes with a voltage whose magnitude is sufficient to raise each of said tunnel diodes into the high current-low voltage region, a coupling circuit comprising an emitter follower transistor connected to said transformer secondary winding for providing a trigger for the next succeeding stage of each stage of said counter, and an AND gate having an output and as many inputs, respectively, as stages in said counter circuit, each input of said AND gate being connected to its respective stage, said AND gate comprising a tunnel diode connected across its output, whereby said AND gate produces an output signal which is representative of the plurality of signals of the tunnel diode counting stages.

References Cited by the Examiner

UNITED STATES PATENTS

| | | | |
|---|---|---|---|
| 2,594,336 | 4/1952 | Mohr | 307—88.5 |
| 2,906,892 | 9/1959 | Jones | 307—88.5 |
| 2,944,164 | 7/1960 | Odell et al. | 307—88.5 |
| 3,021,517 | 2/1962 | Kaenel | 307—88.5 |
| 3,096,445 | 7/1963 | Herzog | 307—88.5 |
| 3,097,312 | 7/1963 | Miller | 307—88.5 |

JOHN W. HUCKERT, *Primary Examiner.*